US 11,255,871 B1

(12) United States Patent
Bhandari et al.

(10) Patent No.: US 11,255,871 B1
(45) Date of Patent: Feb. 22, 2022

(54) DIFFERENTIAL MEMS DEVICE AND METHODS

(71) Applicant: mCube, Inc., San Jose, CA (US)

(72) Inventors: Sanjay Bhandari, San Jose, CA (US); Giovanni Bellusci, San Jose, CA (US)

(73) Assignee: mCube, Inc., San Jose, CA (US)

( * ) Notice: Subject to any disclaimer, the term of this patent is extended or adjusted under 35 U.S.C. 154(b) by 179 days.

(21) Appl. No.: 16/530,923

(22) Filed: Aug. 2, 2019

Related U.S. Application Data

(60) Provisional application No. 62/714,551, filed on Aug. 3, 2018.

(51) Int. Cl.
| | | |
|---|---|---|
| *G01P 15/08* | (2006.01) | |
| *G01P 21/00* | (2006.01) | |
| *B81B 7/00* | (2006.01) | |
| *G01P 15/18* | (2013.01) | |

(52) U.S. Cl.
CPC .............. *G01P 15/08* (2013.01); *B81B 7/008* (2013.01); *G01P 15/18* (2013.01); *G01P 21/00* (2013.01); *B81B 2201/0235* (2013.01); *B81B 2201/0242* (2013.01); *B81B 2201/0264* (2013.01); *G01P 2015/0868* (2013.01)

(58) Field of Classification Search
CPC .......... G01P 15/08; G01P 15/18; G01P 21/00; G01P 21/06; B81B 7/008
See application file for complete search history.

(56) References Cited

U.S. PATENT DOCUMENTS

| | | | | |
|---|---|---|---|---|
| 4,601,206 | A * | 7/1986 | Watson .................. | G01C 21/16 73/510 |
| 6,409,687 | B1 * | 6/2002 | Foxlin .................... | G01S 5/186 600/595 |
| 8,756,995 | B2 * | 6/2014 | Tzidon ................... | G01P 15/08 73/510 |
| 2004/0064252 | A1 * | 4/2004 | Kirkland ............... | G01C 21/16 701/511 |
| 2005/0264429 | A1 * | 12/2005 | Hermary ............. | G05B 19/408 340/870.06 |
| 2010/0299003 | A1 * | 11/2010 | Hanson ................. | G01C 23/00 701/4 |
| 2012/0223846 | A1 * | 9/2012 | Luinge ................... | G01C 21/16 341/87 |
| 2015/0365842 | A1 * | 12/2015 | Bellusci ........... | H04W 28/0252 370/230 |
| 2016/0258779 | A1 * | 9/2016 | Hol ....................... | A61B 5/1121 |
| 2019/0331493 | A1 * | 10/2019 | Bellusci ................ | G01P 15/18 |

* cited by examiner

*Primary Examiner* — Helen C Kwok
(74) *Attorney, Agent, or Firm* — Richard T. Ogawa; Ogawa P.C.

(57) ABSTRACT

A MEMS device includes a first MEMS sensor associated with a first spatial plane and a second MEMS sensor is associated with a spatial second plane not co-planar with the first spatial plane, wherein the first MEMS sensor is configured to provide a first interrupt and a first data in response to a physical perturbation, wherein the second MEMS sensor is configured to provide a second interrupt and second data in response to the physical perturbation, and a controller configured to receive the first interrupt at a first time and the second interrupt at a second time different from the first time, wherein the controller is configured to determine a latency between the first time and the second time, and wherein the controller is configured to determine motion data in response to the first data, to the second data, and to the latency.

20 Claims, 5 Drawing Sheets

ACTUAL MOTION EVENT AT TIME $T_0$ (DATA A1)
READ BY MCU AT DIFFERENT TIMES FOR MULTIPLE SENSORS ($DS_1'$, $DS_2'$, ... $DS_n'$)

$T_{11}$ SIGNAL INPUT TO DIGITAL DATA IN REGISTER (A/D + INTERNAL SIGNAL PATH DELAY)

$T_{12}$ DELAY FROM DATA READY TO INTR $T_{13}$ INTR SIGNAL POLLED BY MCU TO $DS_1$ DATA AVAILABLE (READY FOR PROCESSING) BY MCU $T_{0A}$ ACTUAL TIME WHEN MOTION DATA IS RECORDED
$T_{0B}$ SENSOR FUSION PERFORMED

DIFFERENTIAL MEMS DEVICE AND METHODS

The present application claims benefit of U.S. Provisional Application No. 62/714,551 filed on Aug. 3, 2018, which is incorporated in its entirety herein.

BACKGROUND OF THE INVENTION

The present invention relates to sensors. More specifically, the present invention relates to improving sensor performance with the use of multiple MEMS devices.

A constant challenge in the semiconductor space has been how to produce a high performance device for a low cost (low consumer price). An example of this is seen with microprocessors, where an Intel Core processor greatly outperforms an Intel Celeron processor, however is much more expensive. In the processor market, consumers often accept tradeoffs between processor performance and purchase price.

A similar challenge also applies in the case of sensors, e.g. MEMS-based sensors including accelerometers, magnetometers, gyroscopes, pressure sensors e.g. microphones, and the like. More particularly, the challenge is how to produce a high-performance MEMS for a low cost. There are differences in the sensor market, however, in that because it is a volume business, the price sensitivity is much higher. High performance MEMS devices are required at a low price.

In light of the above, what is desired are improved methods and apparatus to address the problem described above with reduced drawbacks.

BRIEF SUMMARY OF THE INVENTION

The present invention relates to sensors. More specifically, the present invention relates to improving sensor performance with the use of multiple MEMS devices. Low cost sensor devices (e.g. MEMS) intended for consumer applications, tend to have modest performance for parameters such as noise, temp coefficient, etc. In various embodiments, the performance of such lower-cost devices are greatly improved by using multiple sensors to make them suitable for applications requiring higher performance, such as for industrial applications Embodiments of the present invention incorporate multiple MEMS devices into a single sensor device to improve performance of the sensor. The multiple MEMS devices may be oriented in orthogonal directions, in some embodiments, however may be in virtually any orientation with respect to each other. Further, the multiple MEMS devices may provide redundant data, that may be averaged or integrated to provide the sensor output; the multiple MEMS devices may provide differential data, that may filter-out common mode movement or perturbation data; the multiple MEMS devices may provide combination of redundant and differential data; and the like. The MEMS devices may include accelerometers, gyroscopes, magnetometers.

According to one aspect of the invention, a sensor device is described. A system may include an initialization unit configured to simultaneously output a first initialization signal and a second initialization signal, in response to a master initialization signal, and a plurality of tri-axis MEMS sensors coupled to the initialization unit, wherein the plurality of tri-axis MEMS sensors comprises a first tri-axis MEMS sensor and a second tri-axis MEMS sensor, wherein the first tri-axis MEMS sensor is associated with a first spatial plane, wherein the second tri-axis MEMS sensor is associated with a spatial second plane, wherein the first spatial plane and the second spatial plane are not co-planar, wherein the first tri-axis MEMS sensor is configured to provide a first set of data in response to a physical perturbation, wherein the second tri-axis MEMS sensor is configured to provide a second set of data in response to the physical perturbation, wherein the first tri-axis MEMS sensor is configured to provide a first reply in response to the first initialization signal, wherein the second tri-axis MEMS sensor is configured to provide a second reply in response to the second initialization signal. An apparatus may include a controller coupled to the initialization unit and to the plurality of tri-axis MEMS sensors, wherein the controller is configured to provide the master initiation signal to the initialization unit, wherein the controller is configured to receive the first reply at a first time period, wherein the controller is configured to receive the second reply at a second time period, wherein the first time period and the second time period need not be identical, wherein the controller is configured to determine a latency between the first time period and the second time period, wherein the controller is configured to receive the first set of data and the second set of data, and wherein the controller is configured to determine motion data in response to the first set of data, to the second set of data, and to the latency.

According to another aspect of the invention, a sensor device is disclosed. A system may include a plurality of tri-axis MEMS sensors comprising a first tri-axis MEMS sensor and a second tri-axis MEMS sensor, wherein the first tri-axis MEMS sensor is associated with a first spatial plane, wherein the second tri-axis MEMS sensor is associated with a spatial second plane, wherein the first spatial plane and the second spatial plane are not co-planar, wherein the first tri-axis MEMS sensor is configured to provide a first interrupt in response to a physical perturbation, wherein the first tri-axis MEMS sensor is also configured to provide a first set of data in response to the physical perturbation, wherein the second tri-axis MEMS sensor is configured to provide a second interrupt in response to the physical perturbation, wherein the second tri-axis MEMS sensor is also configured to provide a second set of data in response to the physical perturbation. An apparatus may include a controller coupled to the plurality of tri-axis MEMS sensors, wherein the controller is configured to receive the first interrupt at a first time period, wherein the controller is configured to receive the second interrupt at a second time period, wherein the first time period and the second time period need not be identical, wherein the controller is configured to determine a latency between the first time period and the second time period, wherein the controller is configured to receive the first set of data and the second set of data, wherein the controller is configured to determine motion data in response to the first set of data, to the second set of data, and to the latency.

According to yet another aspect of the invention, a method for a sensor device is detailed herein. A technique may include simultaneously receiving in a first tri-axis MEMS sensor and a second tri-axis MEMS sensor an initialization signal, wherein the first tri-axis MEMS sensor is associated with a first spatial plane, wherein the second tri-axis MEMS sensor is associated with a spatial second plane, wherein the first spatial plane and the second spatial plane are not co-planar, outputting from the first tri-axis MEMS sensor a first reply in response to the initialization signal, and outputting from the second tri-axis MEMS sensor a second reply in response to the initialization signal. A process may include receiving in a controller the first reply at a first time period, receiving in the controller the second reply at a second time period, wherein the first time period and the second time period need not be identical, determining in the controller, a latency between the first time period and the second time period, outputting from the first tri-axis MEMS sensor a first set of data in response to a physical perturbation, and outputting from the second tri-axis MEMS sensor a second set of data in response to the physical perturbation. A method may include receiving in the controller the first set of data at a third time period, receiving in the controller the second set of data at a fourth time period, and determining in the controller motion data in response to the first set of data, to the second set of data, to the third time period, to the fourth time period and to the latency.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

In various embodiments of the present invention, three-axis accelerometers provided by the inventors of the present invention are characterized by having low noise for X and Y axis since theses axis are typically sensed using in-plane motion. Data from the X and Y axis tend to have less parasitic noise, etc. compared to data from Z axis since this axis is typically sensed using out of plane motion.

Figure 1:
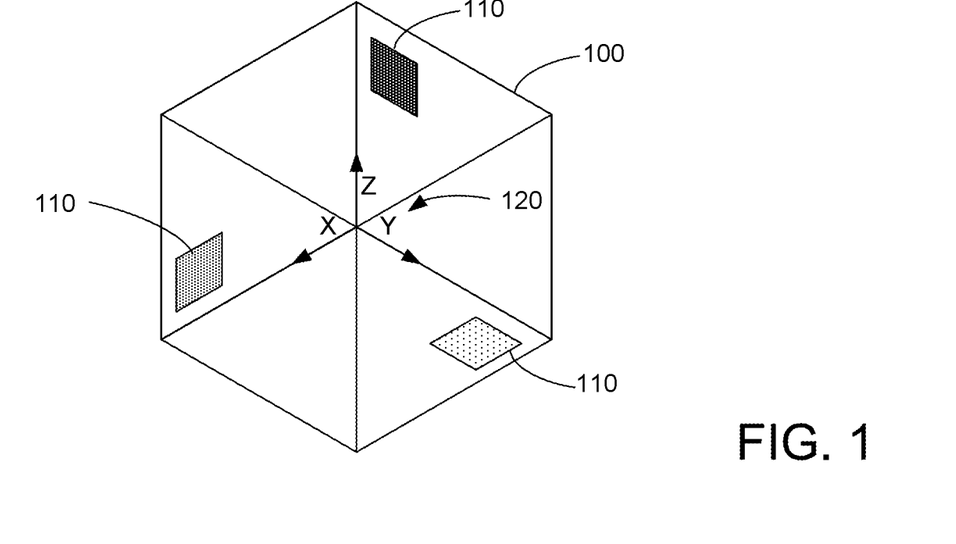
FIG. 1 illustrates a configuration of embodiments of MEMS devices.

FIG. 1 illustrates various embodiments of the present invention. In this figure, a sensor 100 is illustrated having multiple MEMS devices 110 (e.g. accelerometers) that are mounted substantially orthogonally 120 with respect to each other. This type of mounting provides lower noise data for the acceleration on the z-axis. In some embodiments, two or more MEMS devices may be mounted on a substrate, e.g. three, four, five, six, or the like, and may be used to sense the perturbation. In various embodiments of the present invention, post processing at a sensor-hub can perform many operations, including: selection of a particular data stream for each axis, merging of data from multiple sensors to compensate for effects of stress, temp coefficients, drift, etc. (e.g. averaging, integrating, differencing, etc.).

Figure 2:
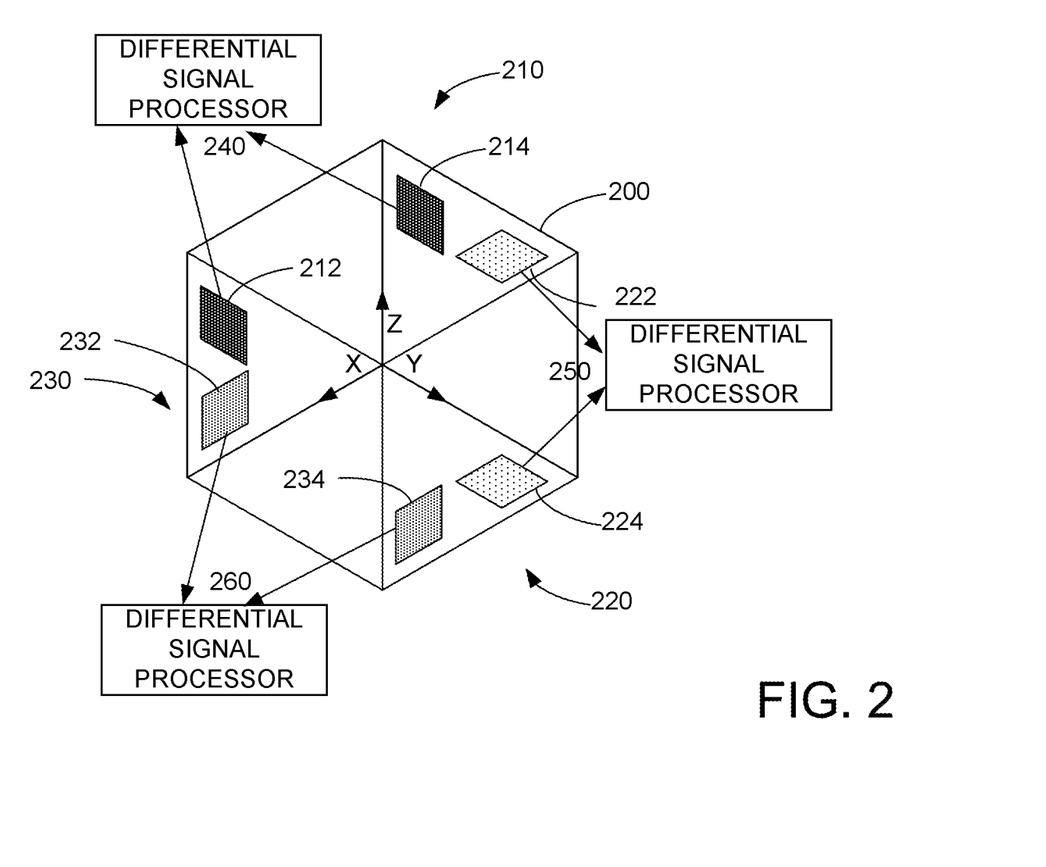
FIG. 2 illustrates another configuration of embodiments of MEMS devices.

FIG. 2 illustrates a block diagram of embodiments of the present invention. More particularly FIG. 2 illustrates a sensor 200 having three different pairs of sensors: 210, 220, and 230. As illustrated, pairs of sensors 210, 220 and 230 are substantially orthogonal with respect to each other and sensors (e.g. 212 and 214, 222 and 224, and 232 and 234) are typically substantially parallel. In this embodiment, sets of differential data (240, 250 and 260) are obtained from pairs of sensors 210, 220 and 230. As will be described below, a microcontroller, or the like receives data from pairs of sensors 210, 220 and 230 and determines physical perturbations based upon sets of differential data 240, 250 and 260.

Figure 3:
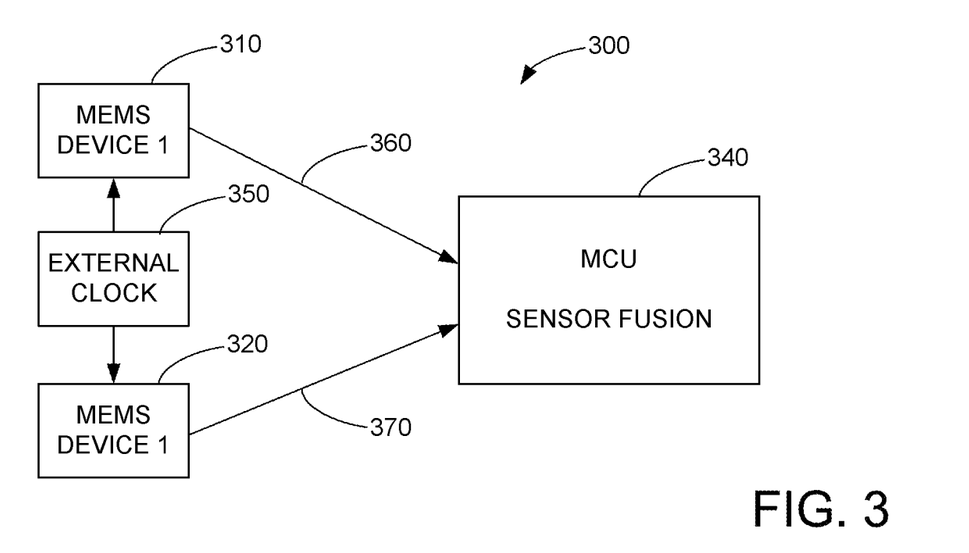
FIG. 3 illustrates a block diagram of embodiments of various embodiments.

FIG. 3 illustrates an embodiment of the present invention. In this figure, a sensor 300 includes at least a first sensor 310 and a second sensor 320, a clock 330 and a processing block 340. Sensors 310 and 320 may be substantially orthogonal, substantially parallel, or skew with respect to each other. In this embodiment, data from the different sensors 310 and 320 that are to be merged or combined must be synchronized. An external clock or clock signal 350 is disclosed to provide a common clock to sensors 310 and 320. The data 360 and 370 provided by sensors 310 and 320 are synchronized and provided to processing block 340 for processing. In one embodiment, sensors 310 and 320 can be synchronized at the system level. In various embodiments, the output data rate of clock 350 maybe increased (e.g. doubled) so that the synchronization between data 360 and 370 may be made more precise.

Figure 4:
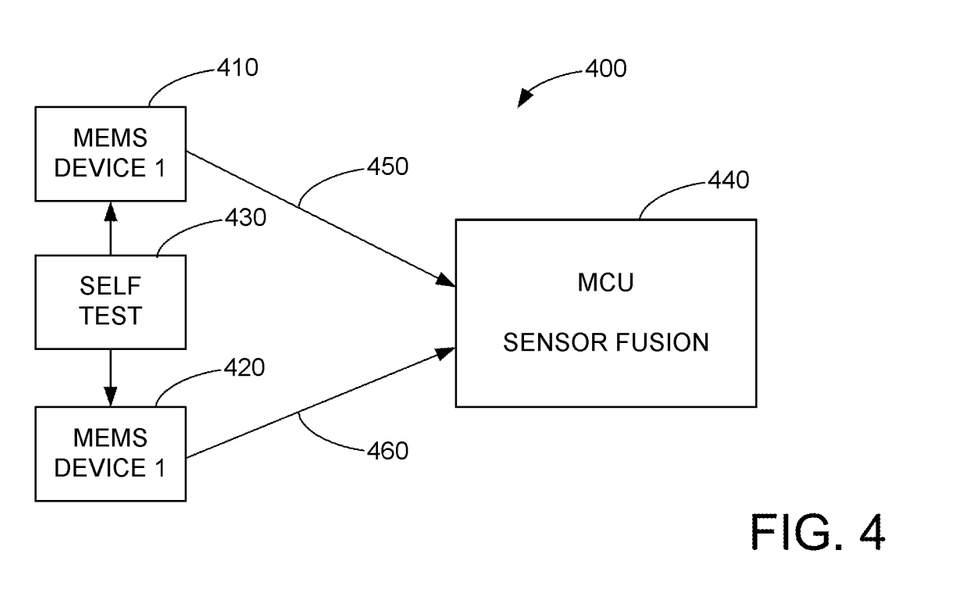
FIG. 4 illustrates another block diagram of embodiments of various embodiments.

FIG. 4 illustrates an embodiment of the present invention. In this figure, a sensor 400 includes at least a first sensor 410 and a second sensor 420, a self-test mechanism 430 and a processing block 440. Sensors 410 and 420 may be substantially orthogonal, substantially parallel, or skew with respect to each other. In this embodiment, data from the different sensors 410 and 420 that are to be merged or combined must again be synchronized. In this embodiment, this is initiated by self-test or calibration mechanism 430. In various embodiments, sensors 410 and 420 each have self-test mechanisms therein, that receive a self-test pulse or initiation command (e.g. via setting a register bit), and in response thereto, that generates a physical perturbation, e.g. a vibration or movement along one or more axes of interest therein. The self-generated perturbation or motion is then sensed by the other components within each respective sensor. The sensed motion waveforms 450 and 460 can be used to synchronize the data (e.g. multi-axis data) from the multiple sensors 410 and 420. In some embodiments, the delay between initiation of the self-test process until when sensed data is output is known, based upon design specification, typically ahead of time. Accordingly, the synchronization can be performed more precisely. In some cases, the synchronization process may be performed once upon start up, at regular intervals, upon demand, or every time to establish time synchronization between multi-axis and multiple device data. As an example, during normal use of the device, a self-test process may be simultaneously performed. In such an example, a modulation or frequency for perturbation motion for the self-test may be different from than the frequency of the movement of the device while in normal use. Since the frequencies may be different, the device could verify synchronization based upon the self-test frequency of the self-test process, while at the same time obtaining perturbation data for the device at another frequency.

Various sensor devices including embodiments of the present invention may include: multiple sensor devices (e.g. MEMS devices, accelerometers, etc.), an aggregator, sensor hub, microcontroller unit (MCU) or application processor chip for performing the function of establishing and maintaining time synchronization between multiple axes and multiple sensor devices.

Figure 5:
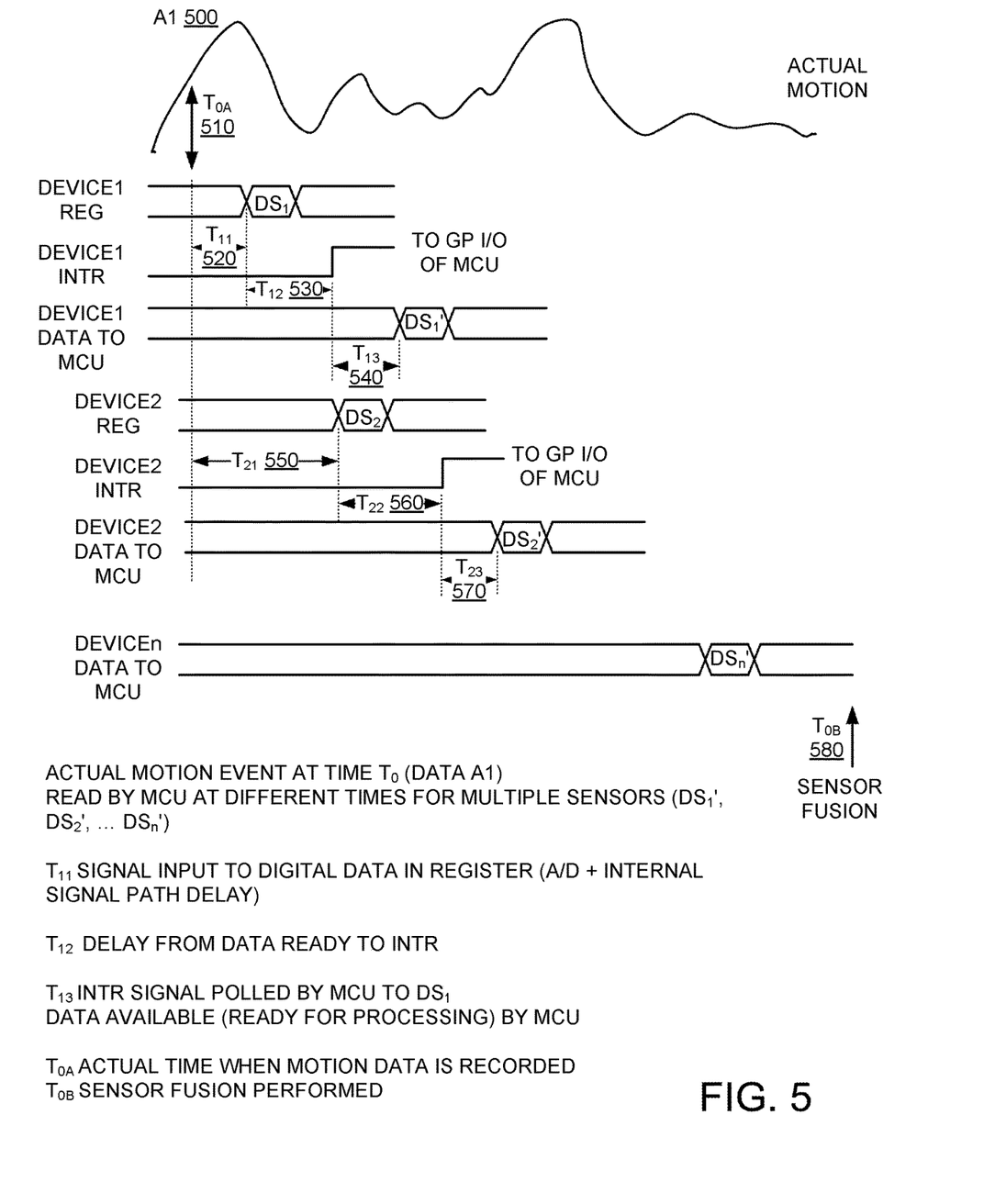
FIG. 5 illustrates timing diagrams of embodiments of various embodiments.
Figure 6:
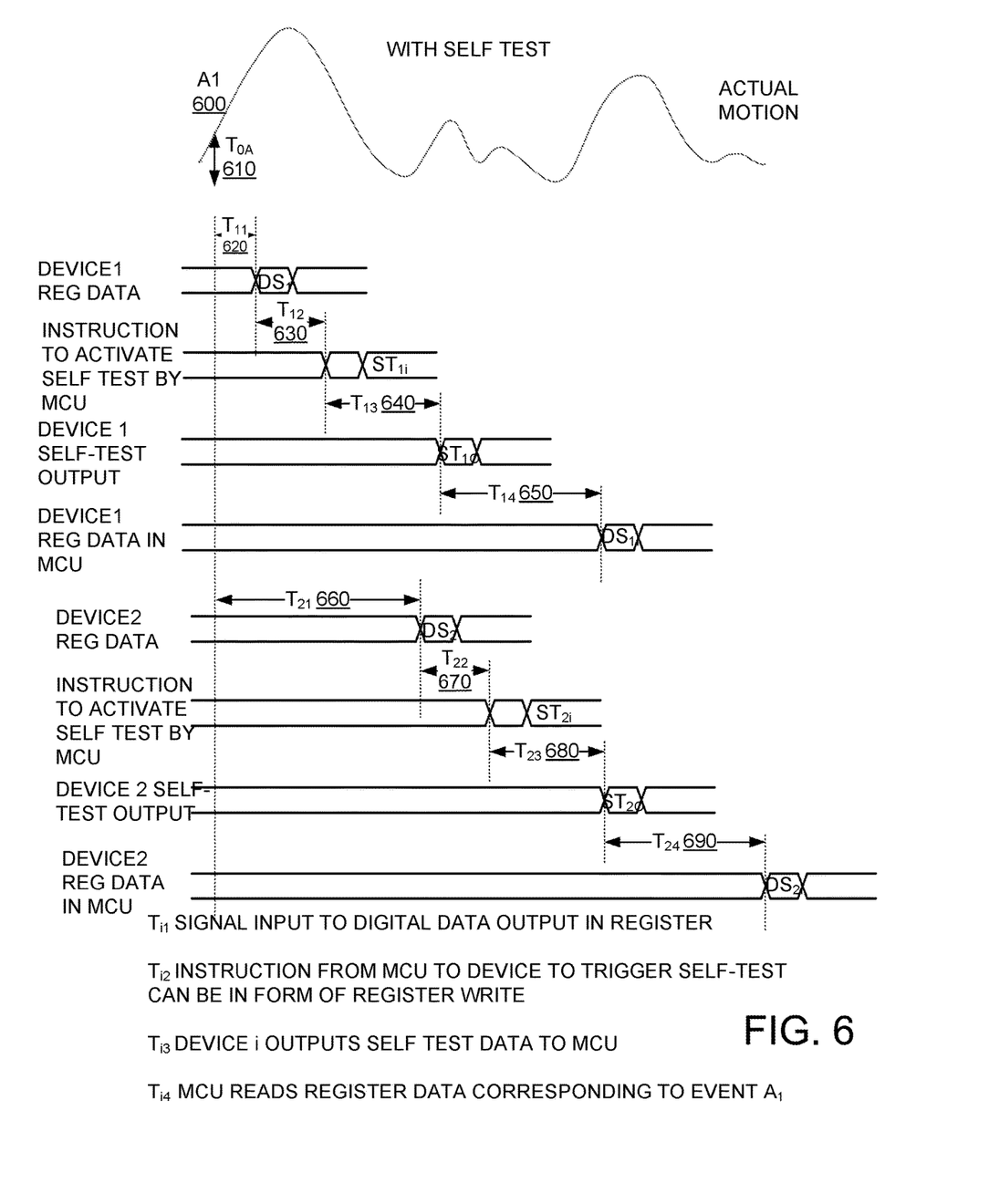
FIG. 6 illustrates timing diagrams of embodiments of various embodiments.

FIGS. 5 and 6 illustrate timing diagrams according to examples of embodiments. In the example in FIG. 5, the integrated device is subject to a physical perturbation A1 500 at time T0A 510.

In FIG. 5, T11 520 represents the amount of time after A1 500, a first sensor puts sensed data into an output register, T12 530 represents the amount of time after data is put into an output register until the first sensor puts out an interrupt signal, and T13 540 represents the amount of time after the interrupt singal, until the MCU reads the sensed data from the first output register. Similarly, T21 550 represents the amount of time after A1, a second sensor puts sensed data into an output register, T22 560 represents the amount of time after data is put into an output register until the second sensor puts out an interrupt signal, and T13 570 represents the amount of time after the interrupt singal, until the MCU reads the sensed data from the second output register. The sum of T11 520, T12 530 and T13 540 and the sum of T21 550, T22 560 and T23 570 are used to characterize a latency between the first output device and the second output device, such that the outputs can fused at time T0B 580 and be attributed to the same input perturbation at time T0A 510.

In the example in FIG. 6, the use of the self-test function is illustrated while the device is in normal operation. In this example, the integrated device is subject to a physical perturbation A1 600 at time T0A 610. In FIG. 6, T11 620 represents the amount of time after A1 600, a first sensor puts sensed data into a first output register, T12 630 represents the amount of time after data is put into an output register until the MCU instructs the first sensor to perform a self-test, T13 640 represents the amount of time after the self-test signal, until the first sensor responds to the self-test data, and T14 650 represents the amount of time after the self-test data is responded, until data is read from the first output register. Similarly, T21 660 represents the amount of time after A1, a second sensor puts sensed data into a second output register, T22 670 represents the amount of time after data is put into an output register until the MCU instructs the second sensor to perform a self-test, T23 680 represents the amount of time after the self-test signal, until the second sensor responds to the self-test data, and T24 690 represents the amount of time after the self-test data is responded, until data is read from the second output register.

In various embodiments, in FIG. 6, T11 620, T12 630, T13 640 and T14 650 and T21 660, T22 670, T23 680 and T24 690 are used to characterize a latency between the first output device and the second output device, such that the first output and the second output can be attributed to the same input perturbation or event at time T0A 610. As an example, T12 630 and T13 640 may be summed and compared to the sum of T22 670 and T23 680. In an ideal situation, these sums should be identical or substantially similar. If not, the difference may be used to adjust the data output latency between these sensors. In various embodiments, when data from more than two sensors are used, the differences between pairs of sensors can also be used to adjust data output latencies among the sensors.

Figure 7:
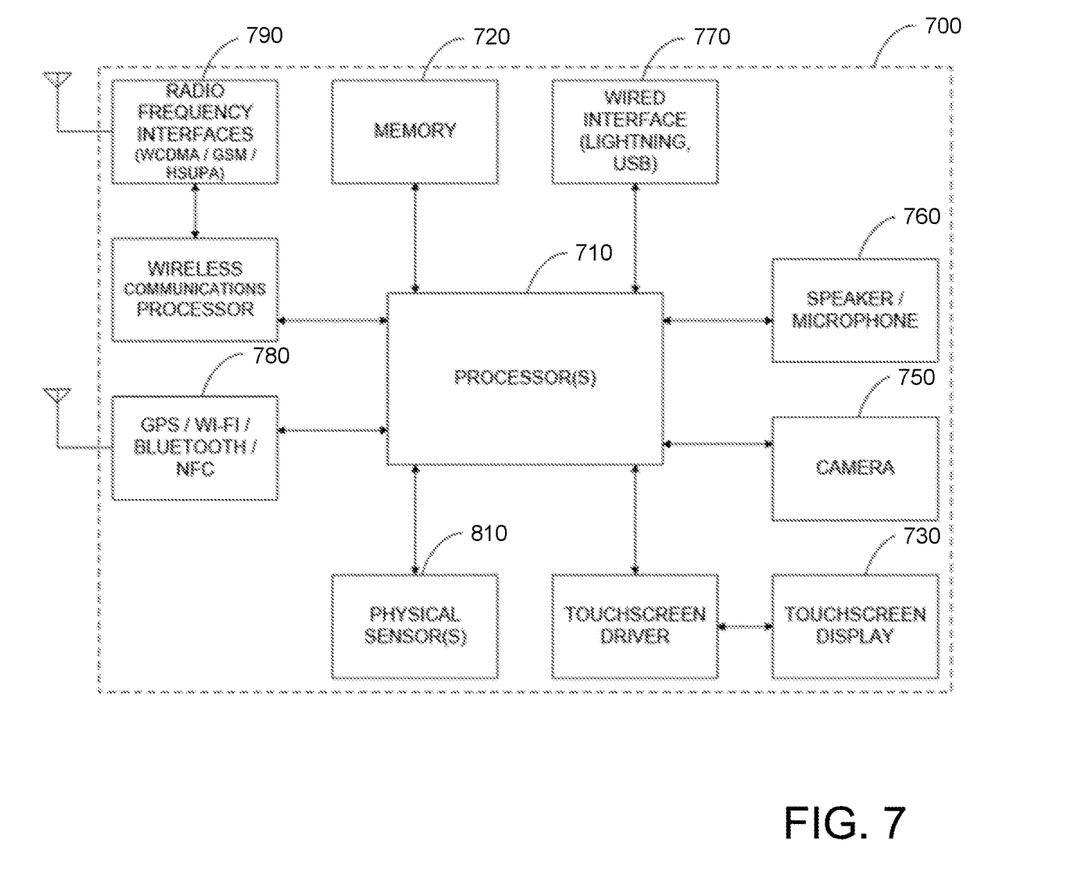
FIG. 7 illustrates a system block diagram of embodiments of the present invention.

FIG. 7 illustrates a functional block diagram of various embodiments of the present invention. More specifically, FIG. 7 illustrates a system including embodiments of the present invention. In FIG. 7, a computing device 600 typically includes some or all of the following: an applications processor 610, memory 620, a touch screen display 630 and driver 640, an image acquisition device 650, audio input/output devices 660, a power supply (e.g. battery) and the like. Additional communications from and to computing device may be provided by via a wired interface 670, a GPS/Wi-Fi/Bluetooth interface 680, RF interfaces 690 and driver 700, and the like. Also included in various embodiments are physical sensors 710.

In various embodiments, computing device 600 may be a hand-held computing device (e.g. Android tablet, Apple iPad), a smart phone (e.g. Apple iPhone, Google Nexus, Samsung Galaxy S), a portable computer (e.g. netbook, laptop, ultrabook), a media player, a reading device (e.g. Amazon Kindle), a wearable device (e.g. Apple Watch, Android watch, FitBit device, or other wearable device), appliances (e.g. washers, vacuum cleaners), autonomous or semi-autonomous vehicles, drones, or the like.

Typically, computing device 600 may include one or more processors 610. Such processors 610 may also be termed application processors, and may include a processor core, a video/graphics core, and other cores. Processors 610 may be a processor from Apple (e.g. A9), Qualcomm (Snapdragon), or the like. In other embodiments, the processor core may be an Intel processor, an ARM Holdings processor such as the Cortex or ARM series processors, or the like. Further, in various embodiments, the video/graphics core may be an ARM processor, Imagination Technologies processor PowerVR graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 620 may include different types of memory (including memory controllers), such as flash memory (e.g. NOR, NAND), pseudo SRAM, DDR SDRAM, or the like. Memory 620 may be fixed within computing device 600 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, a touch screen display 630 and driver 640 may be provided and based upon a variety of later-developed or current touch screen technology including: resistive displays, capacitive displays, optical sensor displays, or the like. Additionally, touch screen display 630 may include single touch or multiple-touch sensing capability. Any later-developed or conventional output display technology may be used for the output display, such as TFT-LCD, OLED, Plasma, electronic ink (e.g. electrophoretic, electrowetting, interferometric modulating), or the like. In various embodiments, the resolution of such displays and the resolution of such touch sensors may be set based upon engineering or non-engineering factors (e.g. sales, marketing). In some embodiments of the present invention, a display output port, such as an HDMI-based port, DVI-based port, or the like may also be included.

In some embodiments of the present invention, image capture device 650 may be provided and include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, proximity detection, or the like.

In various embodiments, audio input/output 660 may be provided and include microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 610 to enable the user to operate computing device 600 by stating voice commands. Additionally, a speech engine may be provided in various embodiments to enable computing device 600 to provide audio status messages, audio response messages, or the like.

In various embodiments, wired interface 670 may be used to provide data transfers between computing device 600 and an external source, such as a computer, a remote server, a storage network, another computing device 600, or the like. Such data may include application data, operating system data, firmware, or the like. Embodiments may include any later-developed or conventional physical interface/protocol, such as: USB, USB-C, Firewire, Apple Lightning connector, Ethernet, POTS, or the like. Additionally, software that enables communications over such networks is typically provided.

In various embodiments, a wireless interface 680 may also be provided to provide wireless data transfers between computing device 600 and external sources, such as computers, storage networks, headphones, microphones, cameras, or the like. As illustrated in FIG. 8, wireless protocols may include Wi-Fi (e.g. IEEE 802.11 a/b/g/n, WiMax), Bluetooth, IR, near field communication (NFC), ZigBee, ZWave, and the like.

GPS receiving capability may also be included in various embodiments of the present invention, however is not required. As illustrated in FIG. 6, GPS functionality is included as part of wireless interface 680 merely for sake of convenience, although in implementation, such functionality is currently performed by circuitry that is distinct from the Wi-Fi circuitry and distinct from the Bluetooth circuitry.

Additional wireless communications may be provided via RF interfaces 690 and drivers 700 in various embodiments. In various embodiments, RF interfaces 690 may support any future-developed or conventional radio frequency communications protocol, such as CDMA-based protocols (e.g. WCDMA), GSM-based protocols, HSUPA-based protocols, or the like. In the embodiments illustrated, driver 700 is illustrated as being distinct from applications processor 610. However, in some embodiments, the functionality are provided upon a single IC package, for example the Marvel PXA330 processor, and the like. It is contemplated that some embodiments of computing device 600 need not include the RF functionality provided by RF interface 690 and driver 700.

FIG. 7 also illustrates computing device 700 to include physical sensors 810. According to various embodiments, computing device 700 may include conventional components such as a microcontroller or processor 710, a memory 720, a (optional) display and driver 730, a (optional) image input device 750, an (optional) audio input or output device 760, a communications interface 770, a (optional) GPS/local interface 780, an (optional) RF interface and driver 7900, and the like.

In various embodiments of the present invention, physical sensors 810 are multi-axis Micro-Electro-Mechanical Systems (MEMS) based devices being developed by m-Cube, the assignee of the present patent application. Such sensors typically include very low power three-axis sensors (linear, gyro or magnetic); ultra-low jitter three-axis sensors (linear, gyro or magnetic); low cost six-axis motion sensor (combination of linear, gyro, and/or magnetic); ten-axis sensors (linear, gyro, magnetic, pressure); and various combinations thereof. As discussed above, multiple physical sensors 810 may be used and be orientated orthogonal to each other, and pairs of sensors 810 may be parallel to each other. The data from physical sensors 810 may include differential data.

FIG. 7 is representative of one computing device 700 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 7. For example, in various embodiments, computing device 700 may lack one or more of the above functional blocks, such as image acquisition unit 750, or RF interface 790 and/or driver or GPS capability, a user input device (e.g. keyboard), or the like. Further, it should be understood that multiple functional blocks may be embodied into a single physical package or device, and various functional blocks may be divided and be performed among separate physical packages or devices.

Further embodiments can be envisioned to one of ordinary skill in the art after reading this disclosure. For example, in some embodiments, a sensor device including multiple sensors (e.g. MEMS devices) can be operated at higher output data rates to allow finer adjustment synchronization between the devices.

In other embodiments, combinations or sub-combinations of the above disclosed invention can be advantageously made. In some examples, multiple sensors may also provide redundancy for critical applications. If one sensor is damaged or does not provide appropriate data, in response to a physical perturbation, the sensed data from the remaining sensors may be used to compensate for the loss of the one sensor. In still other examples, environmental sensors, such as temperature, humidity, pressure, radiation sensors or the like may also be incorporated into a system, e.g. provided to the local processor. Such data may be used to compensate for temperature, temperature of coefficient offsets, temperature drift, radiation exposure of at least one, but not all MEMS devices, and the like. In other embodiments, instead of relying upon self-test functionality, the manufacturer or the user under specific conditions may provide a single perturbation event, e.g. a knock, a drop, or the like. According to such embodiments, the time delay between the MCU receiving data from the different MEMS devices based upon the event can then be used to determine a latency between these sensors. Similar to the above examples, the latency may be used to better synchronize data received from these MEMS devices going forward in time.

The block diagrams of the architecture and flow charts are grouped for ease of understanding. However, it should be understood that combinations of blocks, additions of new blocks, re-arrangement of blocks, and the like are contemplated in alternative embodiments of the present invention. The examples and embodiments described herein are for illustrative purposes only and that various modifications or changes in light thereof will be suggested to persons skilled in the art and are to be included within the spirit and purview of this application and scope of the appended claims.

What is claimed is:
1. A sensor device comprising:
   an initialization unit configured to output a first initialization signal and a second initialization signal, in response to a master initialization signal;

a plurality of tri-axis MEMS sensors coupled to the initialization unit, wherein the plurality of tri-axis MEMS sensors comprises a first tri-axis MEMS sensor and a second tri-axis MEMS sensor, wherein the first tri-axis MEMS sensor is associated with a first spatial plane, wherein the second tri-axis MEMS sensor is associated with a spatial second plane, wherein the first spatial plane and the second spatial plane are not co-planar, wherein the first tri-axis MEMS sensor is configured to provide a first set of data in response to a physical perturbation, wherein the second tri-axis MEMS sensor is configured to provide a second set of data in response to the physical perturbation, wherein the first tri-axis MEMS sensor is configured to provide a first reply in response to the first initialization signal, wherein the second tri-axis MEMS sensor is configured to provide a second reply in response to the second initialization signal; and a controller coupled to the initialization unit and to the plurality of tri-axis MEMS sensors, wherein the controller is configured to provide the master initiation signal to the initialization unit, wherein the controller is configured to receive the first reply at a first time period, wherein the controller is configured to receive the second reply at a second time period, wherein the first time period and the second time period need not be identical, wherein the controller is configured to determine a latency between the first time period and the second time period, wherein the controller is configured to receive the first set of data and the second set of data, and wherein the controller is configured to synchronize the first set of data and the second set of data to form motion data in response to the latency.

2. The sensor device of claim 1 wherein the plurality of tri-axis MEMS sensors each comprise a single type of MEMS sensor, wherein the single type of MEMS sensor is selected from a group consisting of: an accelerometer, a gyroscope, a magnetometer.

3. The sensor device of claim 1
wherein the first spatial plane and the second spatial plane are parallel;
wherein the first set of data and the second set of data form differential data; and
wherein the controller is configured to determine motion data in response to the differential data and to the latency.

4. The sensor device of claim 1 wherein the first spatial plane and the second spatial plane are orthogonal.

5. The sensor device of claim 1 wherein the first tri-axis MEMS sensor comprises a self-test circuit configured to perform a self-test in response to the first initialization signal.

6. The sensor device of claim 5
wherein the self-test circuit is configured to provide a self-test physical perturbation to the first tri-axis MEMS sensor in response to the first initialization signal; and
wherein the first tri-axis MEMS sensor is configured to provide the first reply in response to the self-test physical perturbation.

7. The sensor device of claim 1
wherein the motion data is characterized by a first noise factor;
wherein the first set of data is characterized by a second noise factor; and
wherein the first noise factor is smaller than the second noise factor.

8. A sensor device comprising:
a plurality of tri-axis MEMS sensors comprising a first tri-axis MEMS sensor and a second tri-axis MEMS sensor, wherein the first tri-axis MEMS sensor is associated with a first spatial plane, wherein the second tri-axis MEMS sensor is associated with a spatial second plane, wherein the first spatial plane and the second spatial plane are not co-planar, wherein the first tri-axis MEMS sensor is configured to provide a first interrupt in response to a physical perturbation, wherein the first tri-axis MEMS sensor is also configured to provide a first set of data in response to the physical perturbation, wherein the second tri-axis MEMS sensor is configured to provide a second interrupt in response to the physical perturbation, wherein the second tri-axis MEMS sensor is also configured to provide a second set of data in response to the physical perturbation; and a controller coupled to the plurality of tri-axis MEMS sensors, wherein the controller is configured to receive the first interrupt at a first time period, wherein the controller is configured to receive the second interrupt at a second time period, wherein the first time period and the second time period need not be identical, wherein the controller is configured to determine a latency between the first time period and the second time period, wherein the controller is configured to receive the first set of data and the second set of data, wherein the controller is configured to synchronize the first set of data to the second set of data to form motion data in response to the latency.

9. The sensor device of claim 8 wherein the plurality of tri-axis MEMS sensors comprises a single type of MEMS sensor, wherein the single type of MEMS sensor is selected from a group consisting of: an accelerometer, a gyroscope, a magnetometer.

10. The sensor device of claim 8
wherein the first spatial plane and the second spatial plane are parallel;
wherein the first set of data and the second set of data form differential data; and
wherein the controller is configured to determine motion data in response to the differential data and to the latency.

11. The sensor device of claim 8 wherein the first spatial plane and the second spatial plane are orthogonal.

12. The sensor device of claim 8 wherein the plurality of tri-axis MEMS devices are coupled to the controller via a serial bus.

13. The sensor device of claim 8
wherein the first tri-axis MEMS device is operated at a first frequency;
wherein the second tri-axis MEMS device is operated at a second frequency; and
wherein the first frequency and the second frequency are different.

14. The sensor device of claim 8
wherein the controller is configured to receive the first set of data at a third time period and the second set of data at a fourth time period; and
wherein the controller is configured to synchronize the first set of data to the second set of data to form the motion data in response to the third time period, to the fourth time period and to the latency.

15. A method for a sensor device comprising:
simultaneously receiving in a first tri-axis MEMS sensor and a second tri-axis MEMS sensor an initialization signal, wherein the first tri-axis MEMS sensor is associated with a first spatial plane, wherein the second tri-axis MEMS sensor is associated with a spatial second plane, wherein the first spatial plane and the second spatial plane are not co-planar;

outputting from the first tri-axis MEMS sensor a first reply in response to the initialization signal;

outputting from the second tri-axis MEMS sensor a second reply in response to the initialization signal;

receiving in a controller the first reply at a first time period;

receiving in the controller the second reply at a second time period, wherein the first time period and the second time period need not be identical;

determining in the controller, a latency between the first time period and the second time period;

outputting from the first tri-axis MEMS sensor a first set of data in response to a physical perturbation;

outputting from the second tri-axis MEMS sensor a second set of data in response to the physical perturbation;

receiving in the controller the first set of data at a third time period;

receiving in the controller the second set of data at a fourth time period; and synchronizing in the controller the first set of data to the second set of data to form motion data in response to the third time period, to the fourth time period and to the latency.

16. The method of claim 15 wherein the first reply and the second reply are selected from a group consisting of: accelerometer data, gyroscope rotational data, and magnetic data.

17. The method of claim 15 wherein the first spatial plane and the second spatial plane are orthogonal.

18. The method of claim 15
wherein the first spatial plane and the second spatial plane are parallel; and
wherein the method further comprises:
determining in the controller differential data in response to the first set of data and the second set of data; and
wherein the determining in the controller motion data comprises determining in the controller motion data in response to the differential data.

19. The method of claim 15
wherein the initialization signal comprises a self-test command; and
wherein the outputting from the first tri-axis MEMS sensor the first reply comprises outputting from the first tri-axis MEMS sensor a self-test response in response to the self-test command.

20. The method of claim 19 wherein the outputting from the first tri-axis MEMS sensor the self-test response comprises:
providing in the first tri-axis MEMS sensor a self-test physical perturbation; and
determining the self-test response in response to the self-test perturbation.

* * * * *